United States Patent
Wang et al.

(10) Patent No.: US 8,853,824 B1
(45) Date of Patent: Oct. 7, 2014

(54) ENHANCED TUNNEL FIELD EFFECT TRANSISTOR

(71) Applicant: National Chiao Tung University, Hsinchu (TW)

(72) Inventors: Pei-Yu Wang, Hsinchu (TW); Bing-Yue Tsui, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 14/031,301

(22) Filed: Sep. 19, 2013

(51) Int. Cl.
*H01L 21/70* (2006.01)
*H01L 29/78* (2006.01)
*H01L 29/10* (2006.01)

(52) U.S. Cl.
CPC ............ *H01L 29/78* (2013.01); *H01L 29/1033* (2013.01)
USPC .......................................... 257/547; 257/656

(58) Field of Classification Search
CPC .............................. H01L 29/78; H01L 29/1033
USPC ................................................. 257/547, 656
See application file for complete search history.

(56) References Cited

U.S. PATENT DOCUMENTS

| | | | |
|---|---|---|---|
| 7,678,635 B2* | 3/2010 | Clavelier et al. | 438/197 |
| 2014/0175376 A1* | 6/2014 | Avci et al. | 257/12 |

OTHER PUBLICATIONS

Pei-Yu Wang et al., "Epitaxial Tunnel Layer Structure for Complementary Tunnel FETs Enhancement", Sep. 25, 2012, International Conference on Solid State Devices and Materials (SSDM 2012), kyoto, Japan.

* cited by examiner

*Primary Examiner* — William D Coleman
(74) *Attorney, Agent, or Firm* — Bacon & Thomas, PLLC

(57) ABSTRACT

An enhanced tunnel field effect transistor includes a substrate, a layer of P-I-N structure, a hetero-material layer, a gate dielectric layer, a gate structure and a spacer, in which the layer of P-I-N structure is disposed on the substrate, the hetero-material layer is disposed on portion of the layer of P-I-N structure, the gate dielectric layer is disposed on the hetero-material layer, the gate structure is disposed the gate dielectric layer and a spacer is disposed on a sidewall of the hetero-material layer, the gate dielectric layer, and the gate structure. The hetero-material layer can increase the tunneling efficiency of the enhanced tunnel field effect transistor to increase the conductor current to improve the enhanced tunnel field effect transistor performance.

7 Claims, 4 Drawing Sheets

ENHANCED TUNNEL FIELD EFFECT TRANSISTOR

BACKGROUND OF THE INVENTION

1. Field of the Invention

The present invention relates to an enhanced tunnel field effect transistor, and in particular to an enhanced tunnel field effect transistor with an epitaxial tunnel layer therein.

2. Description of the Prior Art

In recent years, the green energy issue is attracted a lot of attention for many people. As the MOSFET (Metal Oxide Semiconductor Field Effect Transistor) scales down rapidly, a large number of devices result in high standby and dynamic power consumption. To eliminate this undesirable phenomenon, lowering the off-state leakage current and operating voltage are the two intuitive methods to achieve these demands. As the reduction of the leakage current and operating voltage, steep S.S. is required to achieve sufficient on-state current to drive the circuits. In conventional MOSFET, the operation principle of thermionic carrier injection limits from the steep S.S. to 60 mV/decade at the room temperature. This physical constraint limits the scaling of threshold voltage and the operating voltage.

The tunnel FET (tunnel field effect transistor) becomes an appropriate candidate of such low power application device due to the tunnel FET with intrinsic operation characteristics. The distinct operation mechanism, band-to-band tunneling (BTBT), is applied to a tunnel FET device which breaks the limitation of 60 mV/decade and makes the opportunities to push the low power application into a new generation. However, the steep S.S. in tunnel FET only occurs at very low current levels and degrades rapidly due to inefficient BTBT. To improve the tunneling efficiency, low band-gap material introduction has been proposed to lower the tunnel barrier.

Some groups applied low band-gap material only at the source side to enhance the tunneling current. Although it is a great idea to enhance the on-state current and to keep low off-state current, the device is very hard to be implemented and the defect issues at the hetero junction interface is also a serious problem. In addition, the tunnel barrier is usually located in the intrinsic region. It is more intuitive to replace the intrinsic region material instead of the source material.

Other groups used the low band-gap material to replace the whole channel region. This methodology needs to consider the bipolar BTBT effect which could result in higher off-state current. Novel structure of the tunnel FET also has been proposed continuously to improve the performance of tunnel FET. All of them need to control a special doping profile such as ultrathin doping region and ultrahigh doping concentration. It is hard to be realized and may results in large variations in fabrication.

SUMMARY OF THE INVENTION

Thus, according to above drawbacks, in order to improve the tunnel FET performance considering of the fabrication feasibility, the objective of the present invention is to provide a novel epitaxial tunnel layer (ETL) tunnel FET. The ETL structure combines the vertical tunneling and the ETL hetero junction band engineering to enhance on-state current and to keep low off-state current. The most critical parameter in ETL structure is the thickness of $Si_xGe_{1-x}$ ETL film which is more controllable than the ultra abrupt doping profile of the other tunnel devices.

It is an objective of the present invention to provide an epitaxial tunnel layer with various hetero-material to enhance the tunnel efficiency by reducing the tunnel barrier, and the tunnel current can be improved to increase the tunnel FET performance.

It is another objective of the present invention to utilize the overlap region between the epitaxial tunnel layer and P-type silicon and N-type silicon to increase the tunnel-effect area, such that the conductor current can be improved to increase the tunnel FET performance.

It is still another objective of the present invention to provide that the tunneling orientation is the same as the electric field direction modulated by gate, such that the control performance of gate for the tunnel effect can be improved to increase the device performance.

It is yet objective of the present invention to provide the manufacturing process of the enhanced tunnel FET is compatibility with the present CMOS (Complementary Metal Oxide Semiconductor) manufacturing process so as to the value of the application can be increased.

To realize the above objective, the present invention provides an enhanced tunnel field effect transistor includes a substrate, a layer of P-I-N structure, a hetero-material layer, a gate oxide layer, a gate structure and a spacer, in which the layer of P-I-N structure is disposed on the substrate, the hetero-material layer is disposed on portion of the layer of P-I-N structure, the gate oxide layer is disposed on the hetero-material layer, the gate structure is disposed the gate oxide layer and a spacer is disposed on a sidewall of the hetero-material layer, the gate oxide layer, and the gate structure. The hetero-material layer can increase the tunneling efficiency of the enhanced tunnel field effect transistor to increase the conductor current to improve the enhanced tunnel field effect transistor performance.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

The present invention will be apparent to those skilled in the art by reading the following description of a preferred embodiment thereof with reference to the drawings, in which.

DESCRIPTION OF THE PREFERRED EMBODIMENT

Figure 1:
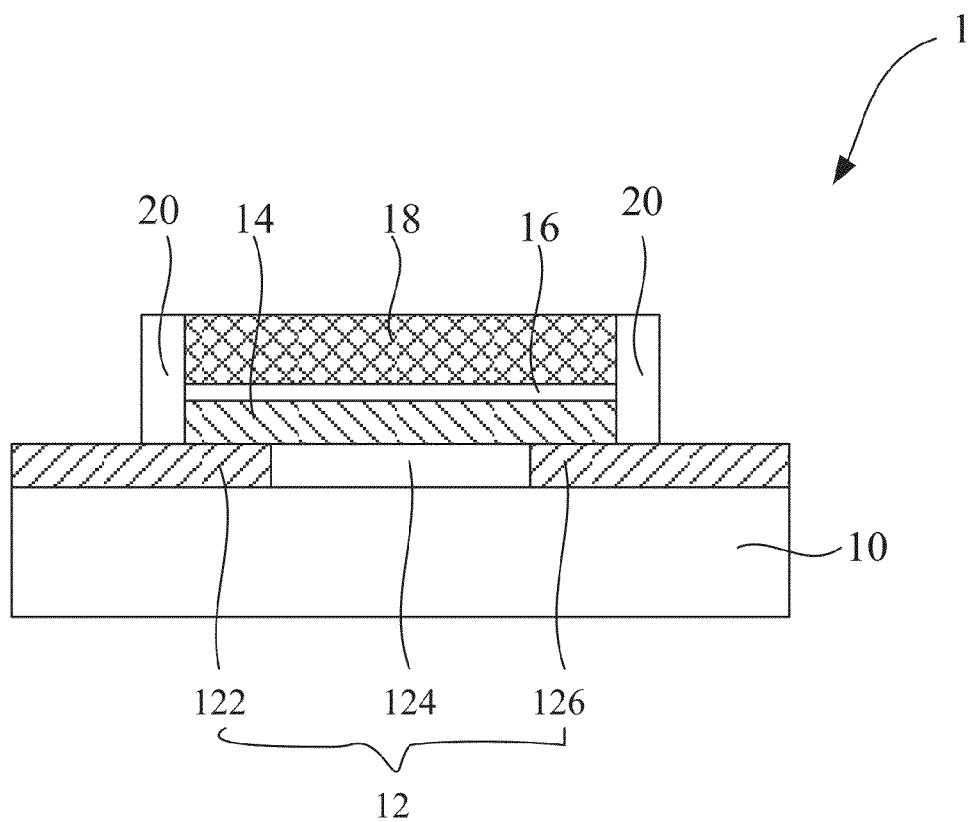
FIG. 1 shows the cross-sectional view of an enhanced tunnel field effect transistor in accordance with the present invention.

Please refer to FIG. 1. FIG. 1 shows the cross-sectional view of an enhanced tunnel field effect transistor of the present invention. The enhanced tunnel field effect transistor 1 includes a substrate 10, a layer of P-I-N structure 12, a hetero-material layer 14, a gate dielectric layer 16, a gate structure 18 and a spacer 20, in which the layer of P-I-N 12 is disposed on the substrate 10, the hetero-material layer 14 is disposed on portion of the layer of P-I-N structure 12, the gate dielectric layer 16 is disposed on the hetero-material layer 14, and the gate structure 18 is disposed on the gate dielectric layer 16, and the spacer 20 is disposed on the sidewall of the hetero-material layer 14, the gate dielectric layer 16 and the gate structure 18.

In this embodiment of the invention, the layer of P-I-N structure 12 includes a P$^+$ silicon structure 122, an intrinsic silicon structure 124, and a N$^+$ silicon structure 126, in which the intrinsic silicon 124 is disposed between the P$^+$ silicon structure 122 and the N$^+$ silicon 126. It is note to illustrate that the P$^+$ silicon structure 122 is drain, N$^+$ silicon structure 126 is source and intrinsic silicon structure 124 is channel, in which the length of intrinsic silicon structure 124 (also called as channel) is 60 nm with a doping concentration of $1 \times 10^{15}/$ cm$^3$. The source (N$^+$ silicon structure) 126/drain (P$^+$ silicon structure) 122 doping concentration is $1 \times 10^{20}/1 \times 10^{18}$ cm$^{-3}$ for N-TFET and $1 \times 10^{18}/1 \times 10^{20}$ cm$^{-3}$ for P-TFET. For the lower doping concentration which is used to suppress the bipolar characteristic.

The hetero-material layer 14 is an epitaxial tunnel layer (also called ETL layer), such as intrinsic silicon or silicon-germanium (Si$_{1-x}$Ge$_x$), in which the x can be 0.3. The hetero-material layer 14 is a low band-gap material to enhance both P-TFET and N-TFET performance.

In addition, the gate dielectric layer 16 is silicon oxide (SiO$_2$), and the gate dielectric layer 16 with 2 nm thick on the hetero-material layer 14. The gate structure 18 is polysilicon, and the work-function is 4.05 eV for N-TFET and 5.15 for P-TFET.

Figure 2:
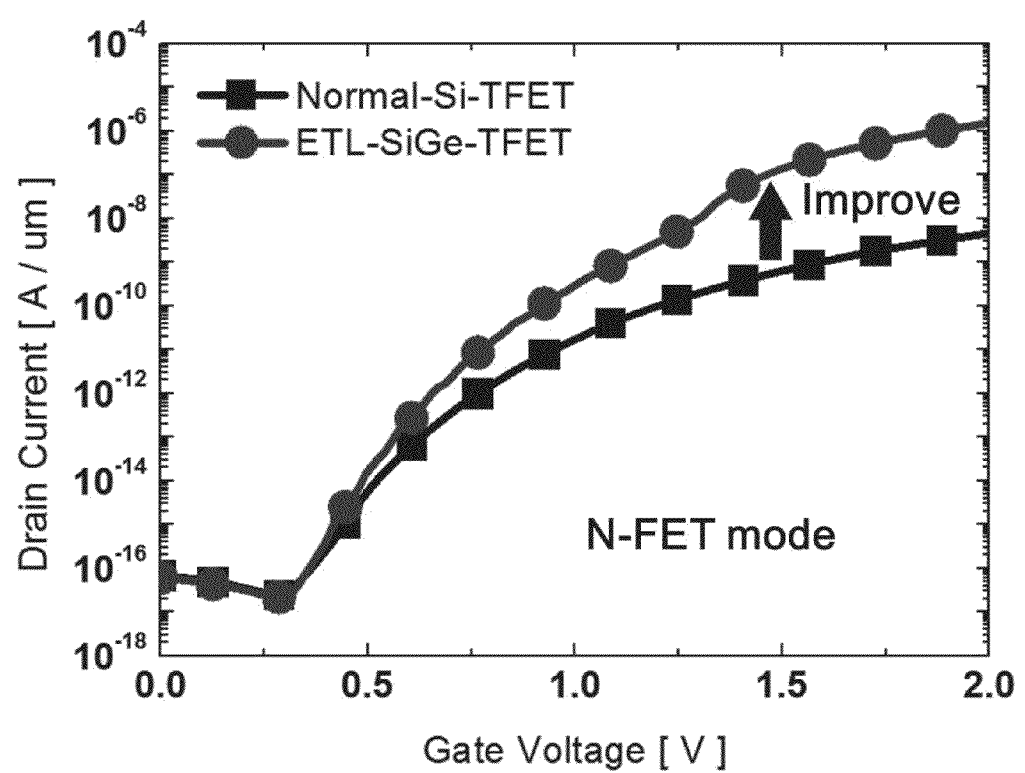
FIG. 2 shows the transfer characteristics of the normal TFET and the ETL-TFET in NFET mode in accordance with the present invention.
Figure 3:
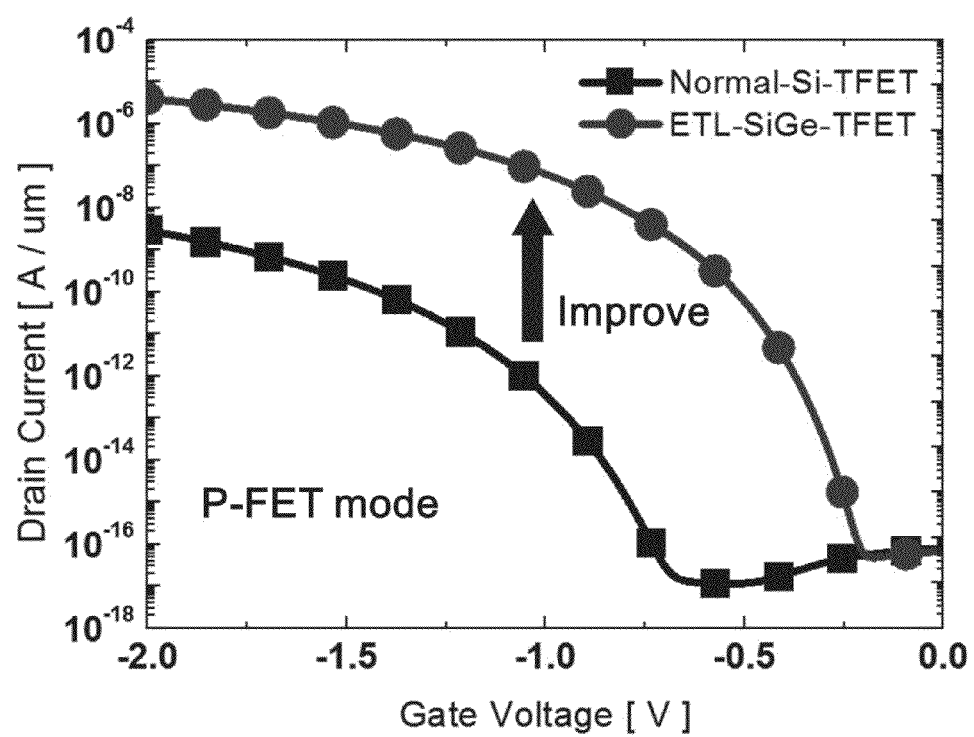
FIG. 3 shows the transfer characteristics of the normal TFET and the ETL-TFET in PFET mode in accordance with the present invention.

Then please refer to FIG. 2 and FIG. 3. FIG. 2 and FIG. 3 show the transfer characteristics of the normal TFET and the ETL-TFET in NFET and PFET mode respectively. It is note to illustrate that the structure of the normal TFET is similar to the ETL-TFET, in which the different is that the normal TFET did not include hetero-material layer 14 therein. Thus, normal TFET did not show the schematic in the invention. In this embodiment of the invention, the hetero-material layer 14 exhibits better on-current performance because the tunneling orientation of ETL-TFET is the same as the electric field direction modulated by gate which makes the gate modulate the potential more effectively. In addition, because the tunneling is designed to occur in the hetero-material layer region, introducing the SiGe material could enhance both N-TFET and P-TFET performance due to band-to-band tunneling (BTBT) in the SiGe layer (hetero-material layer) 14. Although the lower band-gap of SiGe 14 induces higher generation current, the ETL-SiGe-TFET has low off-current due to the small area of the SiGe ETL comparing to the whole channel 124.

The hetero-material layer 14 with low doping design could eliminate the unwanted bipolar characteristic much obviously than the normal TFET because of the strong reduction of the electric field in the hetero-material layer 14. The vertical BTBT is suppressed by the lower source/drain doping concentration with reduce the electric field in the hetero-material layer 14 significantly and the parallel BTBT in channel 124 is suppressed because the ETL shields the channel potential modulation by gate structure 18.

Figure 4:
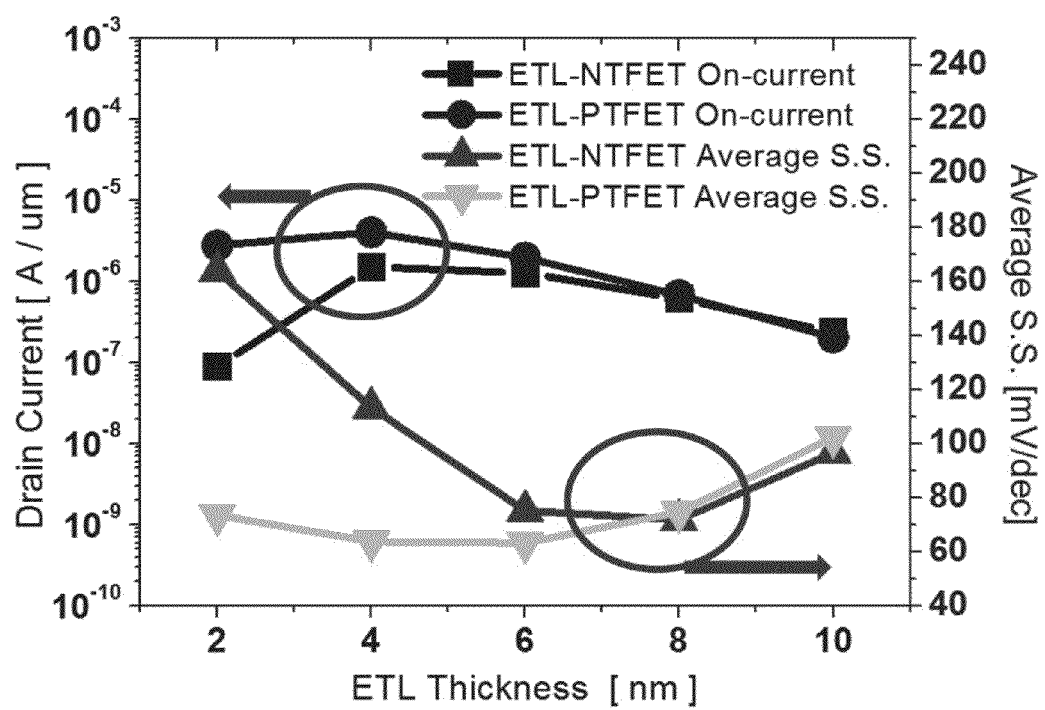
FIG. 4 shows the on-current and the average S.S. ($10^{-15}$~$10^{-9}$ A/um) of ETL-SiGe-TFET in accordance with the present invention.

Next, please refer to FIG. 4. FIG. 4 shows the on-current and the average S.S. ($10^{-15} \sim 10^{-9}$ A/um) of ETL-SiGe-TFET in NFET and PFET mode. It is observed that the optimized thickness of ETL 14 is 4 nm for on-current and 6 nm for average S.S. The significant average S.S. improvement for N-TFET is due to the earlier occurrence of BTBT. The on-current and average S.S. both degrade at too thick ETL 14 due to the electric field degradation.

According to abovementioned, the hetero-material layer 14 can enhance the on-current and eliminate the unwanted bipolar characteristics. By introducing the SiGe ETL, both the N-TFET and P-TFET performance could be improved. For low power application, the hetero-material layer 14 with low band-gap material integration is very promising for TFT performance enhancement.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An enhanced tunnel field effect transistor comprises:
   a substrate;
   a layer of P-I-N structure is disposed on said substrate;
   a hetero-material layer is disposed on said layer of P-I-N structure;
   a gate dielectric layer is disposed on said hetero-material layer;
   a gate structure is disposed on said gate dielectric layer, wherein said hetero-material layer, said gate dielectric layer and said gate structure are disposed on portion of said layer of P-I-N structure; and
   a spacer is disposed on a sidewall of said hetero-material layer, said gate dielectric layer and said gate structure.

2. The enhanced tunnel field effect transistor according to claim 1, wherein said substrate is silicon oxide (SiO$_2$).

3. The enhanced tunnel field effect transistor according to claim 1, wherein said layer of P-I-N structure includes a P$^+$ silicon structure, an intrinsic silicon structure and a N$^+$ silicon structure, and said intrinsic silicon is disposed between said P$^+$ silicon structure and said N$^+$ silicon structure.

4. The enhanced tunnel field effect transistor according to claim 1, wherein said hetero-material layer is an epitaxial tunnel layer.

5. The enhanced tunnel field effect transistor according to claim 4, wherein said epitaxial tunnel layer can be intrinsic silicon or silicon-germanium (SiGe).

6. The enhanced tunnel field effect transistor according to claim 1, wherein said gate dielectric layer is silicon oxide (SiO$_2$).

7. The enhanced tunnel field effect transistor according to claim 1, wherein said spacer and said gate structure is polysilicon.

* * * * *